(12) United States Patent
Lee et al.

(10) Patent No.: US 9,356,022 B2
(45) Date of Patent: May 31, 2016

(54) SEMICONDUCTOR DEVICE WITH TERMINATION STRUCTURE FOR POWER MOSFET APPLICATIONS

(71) Applicant: Alpha and Omega Semiconductor Incorporated

(72) Inventors: Yeeheng Lee, San Jose, CA (US); Madhur Bobde, San Jose, CA (US); Daniel Calafut, San Jose, CA (US); Hamza Yilmaz, Saratoga, CA (US); Xiaobin Wang, San Jose, CA (US); Ji Pan, San Jose, CA (US); Hong Chang, Cupertino, CA (US); Jongoh Kim, Suwon (KR)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 14/807,633

(22) Filed: Jul. 23, 2015

(65) Prior Publication Data

US 2015/0333174 A1 Nov. 19, 2015

Related U.S. Application Data

(63) Continuation of application No. 13/776,523, filed on Feb. 25, 2013, now Pat. No. 9,105,494.

(51) Int. Cl.
*H01L 27/088* (2006.01)
*H01L 21/82* (2006.01)
(Continued)

(52) U.S. Cl.
CPC ............ *H01L 27/088* (2013.01); *H01L 21/308* (2013.01); *H01L 21/823475* (2013.01); *H01L 21/823487* (2013.01); *H01L 27/0251* (2013.01); *H01L 29/0619* (2013.01); *H01L 29/407* (2013.01); *H01L 29/66712* (2013.01);
(Continued)

(58) Field of Classification Search
CPC ...................................................... H01L 21/82
USPC ......................................................... 257/409
See application file for complete search history.

(56) References Cited

U.S. PATENT DOCUMENTS

| 4,941,026 | A | 7/1990 | Temple |
| 5,998,833 | A | 12/1999 | Baliga |

(Continued)

OTHER PUBLICATIONS

Final Office Action for U.S. Appl. No. 13/926,880, dated Sep. 16, 2015.

(Continued)

*Primary Examiner* — Lex Malsawma
(74) *Attorney, Agent, or Firm* — Joshua D. Isenberg; JDI Patent (57) ABSTRACT

A semiconductor device may have an active device region containing a plurality of active devices and a termination structure that surrounds the active device region. The termination structure includes a first conductive region that surrounds the active device region, an insulator region that surrounds the first conductive region, and a second conductive region that surrounds the first conductive region and the insulator region. The active device region and termination structure are formed into a semiconductor material of a first conductivity type. The first conductive region is electrically connected to a gate metal and the second conductive region is connected to a drain metal.

23 Claims, 10 Drawing Sheets

(51) Int. Cl.
*H01L 29/06* (2006.01)
*H01L 29/66* (2006.01)
*H01L 27/02* (2006.01)
*H01L 21/8234* (2006.01)
*H01L 21/308* (2006.01)
*H01L 29/40* (2006.01)
*H01L 29/78* (2006.01)
*H01L 29/417* (2006.01)
*H01L 29/423* (2006.01)

(52) U.S. Cl.
CPC .... *H01L29/66719* (2013.01); *H01L 29/66727* (2013.01); *H01L 29/66734* (2013.01); *H01L 29/7806* (2013.01); *H01L 29/7808* (2013.01); *H01L 29/7811* (2013.01); *H01L 29/7813* (2013.01); *H01L 29/0623* (2013.01); *H01L 29/41766* (2013.01); *H01L 29/42368* (2013.01)

(56) References Cited

U.S. PATENT DOCUMENTS

| | | | |
|---|---|---|---|
| 6,251,730 B1 | 6/2001 | Luo | |
| 6,262,453 B1 | 7/2001 | Hshieh | |
| 7,109,552 B2 | 9/2006 | Wu | |
| 7,183,610 B2 | 2/2007 | Pattanayak et al. | |
| 7,345,342 B2 | 3/2008 | Challa et al. | |
| 7,361,557 B2 | 4/2008 | Inagawa et al. | |
| 7,476,589 B2 | 1/2009 | Grebs et al. | |
| 7,652,326 B2 | 1/2010 | Kocon | |
| 7,691,706 B2 | 4/2010 | Kim | |
| 7,807,576 B2 | 10/2010 | Pan | |
| 7,843,004 B2 | 11/2010 | Darwish | |
| 7,910,439 B2 | 3/2011 | Darwish et al. | |
| 8,247,296 B2 | 8/2012 | Grivna | |
| 8,252,647 B2 | 8/2012 | Lee et al. | |
| 8,399,925 B2 | 3/2013 | Wang et al. | |
| 8,466,513 B2 | 6/2013 | Grivna et al. | |
| 8,575,695 B2 | 11/2013 | Bobde et al. | |
| 8,664,065 B2 | 3/2014 | Grivna | |
| 8,710,582 B2 | 4/2014 | Okumura et al. | |
| 8,710,585 B1 | 4/2014 | Hu et al. | |
| 8,753,935 B1 | 6/2014 | Bobde et al. | |
| 8,809,948 B1 | 8/2014 | Yilmaz et al. | |
| 8,907,414 B2 | 12/2014 | Hu et al. | |
| 8,946,816 B2 | 2/2015 | Bobde et al. | |
| 8,951,867 B2 | 2/2015 | Lee et al. | |
| 9,029,215 B2 | 5/2015 | Hossain et al. | |
| 9,105,494 B2 | 8/2015 | Lee et al. | |
| 9,136,380 B2 | 9/2015 | Yilmaz et al. | |
| 9,190,512 B2 | 11/2015 | Lee et al. | |
| 2003/0127702 A1 | 7/2003 | Blair et al. | |
| 2004/0014451 A1 | 1/2004 | Sapp et al. | |
| 2005/0062124 A1 | 3/2005 | Chiola | |
| 2005/0161758 A1 | 7/2005 | Chiola | |
| 2006/0011976 A1 | 1/2006 | Darwish et al. | |
| 2006/0249785 A1 | 11/2006 | Bhalla et al. | |
| 2007/0134884 A1 | 6/2007 | Kim et al. | |
| 2008/0035993 A1* | 2/2008 | Cao | H01L 29/407 257/333 |
| 2008/0073707 A1 | 3/2008 | Darwish | |
| 2008/0179662 A1 | 7/2008 | Hshieh | |
| 2008/0197408 A1 | 8/2008 | Disney et al. | |
| 2008/0283956 A1 | 11/2008 | Hshieh et al. | |
| 2009/0008706 A1 | 1/2009 | Yedinak et al. | |
| 2009/0057756 A1* | 3/2009 | Hshieh | H01L 29/0661 257/330 |
| 2009/0085105 A1* | 4/2009 | Su | H01L 29/7813 257/330 |
| 2009/0224312 A1 | 9/2009 | Taketani | |
| 2009/0309156 A1 | 12/2009 | Darwish et al. | |
| 2009/0315083 A1 | 12/2009 | Pan et al. | |
| 2010/0001331 A1 | 1/2010 | Mikasa | |
| 2010/0187642 A1 | 7/2010 | Grivna | |
| 2011/0006363 A1* | 1/2011 | Hsieh | H01L 29/7813 257/330 |
| 2011/0049596 A1 | 3/2011 | Lee et al. | |
| 2011/0121386 A1 | 5/2011 | Hsieh | |
| 2011/0177662 A1 | 7/2011 | Yilmaz et al. | |
| 2011/0177663 A1 | 7/2011 | Kachi | |
| 2011/0284955 A1 | 11/2011 | Sapp et al. | |
| 2012/0030644 A1 | 2/2012 | Lamant | |
| 2012/0146090 A1 | 6/2012 | Lui et al. | |
| 2012/0220091 A1 | 8/2012 | Challa et al. | |
| 2012/0248566 A1 | 10/2012 | Bobde et al. | |
| 2012/0276701 A1 | 11/2012 | Yedinak et al. | |
| 2012/0292693 A1 | 11/2012 | Lee et al. | |
| 2013/0002635 A1 | 1/2013 | Yamashita et al. | |
| 2013/0020577 A1 | 1/2013 | Hsieh | |
| 2013/0020671 A1 | 1/2013 | Lee et al. | |
| 2013/0119394 A1 | 5/2013 | Zhu et al. | |
| 2013/0168761 A1* | 7/2013 | Hsieh | H01L 29/407 257/330 |
| 2013/0207172 A1* | 8/2013 | Hsieh | H01L 29/78 257/315 |
| 2013/0248995 A1 | 9/2013 | Nishiwaki et al. | |
| 2013/0330892 A1* | 12/2013 | Hsieh | H01L 29/66825 438/259 |
| 2014/0048846 A1 | 2/2014 | Lui et al. | |
| 2014/0097491 A1* | 4/2014 | Bulucea | H01L 29/7811 257/341 |
| 2014/0170823 A1 | 6/2014 | Lin | |
| 2014/0175536 A1 | 6/2014 | Lee et al. | |
| 2014/0239382 A1 | 8/2014 | Bobde et al. | |
| 2014/0239388 A1 | 8/2014 | Lee et al. | |
| 2014/0239436 A1 | 8/2014 | Hu et al. | |
| 2014/0264567 A1* | 9/2014 | Challa | H01L 29/66666 257/330 |
| 2014/0339630 A1 | 11/2014 | Yilmaz et al. | |
| 2014/0374824 A1 | 12/2014 | Calafut et al. | |
| 2015/0137227 A1 | 5/2015 | Bobde et al. | |
| 2015/0145037 A1 | 5/2015 | Lee et al. | |
| 2015/0333174 A1 | 11/2015 | Lee et al. | |
| 2015/0380544 A1 | 12/2015 | Yilmaz et al. | |

OTHER PUBLICATIONS

Non-Final Office Action for U.S. Appl. No. 13/926,880, dated Mar. 17, 2015.
Non-Final Office Action for U.S. Appl. No. 14/566,294, dated Jul. 14, 2015.
Non-Final Office Action for U.S. Appl. No. 14/606,928, dated Apr. 10, 2015.
Non-Final Office Action for U.S. Appl. No. 13/776,523, dated Sep. 25, 2014.
Non-Final Office Action U.S. Appl. No. 14/845,128, dated Dec. 22, 2015.
U.S. Appl. No. 14/937,636, to Yeeheng Lee, et al., filed Nov. 24, 2015.
Non-Final Office Action for U.S. Appl. No. 14/937,636, dated Feb. 8, 2016.

* cited by examiner

SEMICONDUCTOR DEVICE WITH TERMINATION STRUCTURE FOR POWER MOSFET APPLICATIONS

CLAIM OF PRIORITY

This application is a continuation of commonly-assigned U.S. patent application Ser. No. 13/776,523, filed Feb. 25, 2013, the entire contents of which are incorporated herein by reference.

FIELD OF THE INVENTION

This invention generally relates to power MOSFETS. Specifically, the invention is directed to a trench based termination structure for power MOSFET devices.

BACKGROUND OF THE INVENTION

Careful design of the active cells in a power MOSFET device may provide for an increased breakdown voltage. However, the design of the active cells typically do not provide protection for localize portions of the device. Specifically, a device may be susceptible to failure because of the steep voltage gradient near the edges of the device. At the edge of the device the electric field needs to be reduced from the source potential to the drain potential in a smooth manner.

Prior art efforts to smoothly reduce the voltage gradient typically take up a relatively large amount of space near the edge of the device die. Attempts to use trench based termination structures to smoothly reduce the voltage to the drain potential requires multiple trenches to be formed near the edges of the die. The extra space needed for the termination region is space that active devices are not capable of being used for. The use of termination trenches also can render the outermost trench in the active area inactive. As such, even more space may be lost to the termination region. In addition to the extra space needed for multiple trenches, the trenches may also require additional processing steps. This could result in an increase of the cost of the devices. Therefore, there is a need in the art for a compact termination region that is capable of enabling the outermost trench to be a functioning trench as well.

It is within this context that embodiments of the present invention arise.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion, devices with an N-type epitaxial layer and a P-type top layer are described for purposes of illustration. Substantially similar devices may be fabricated using a similar process but with opposite conductivity types.

Aspects of the present disclosure describe termination structures for power MOSFET devices and methods for manufacturing the same. According to a first aspect of the present disclosure, a termination trench may be formed around an active area where the active devices are formed. The termination trench may comprise first and second conductive portions. The conductive portions may be separated from each other by an insulative material. According to aspects of the present disclosure, both conductive portions may be electrically floating. According to additional aspects of the present disclosure, the first conductive portion may be maintained at gate potential, and the second conductive portion may be maintained at drain potential. The termination trench may also optionally include a field lined tuning region.

Additional aspects of the present disclosure further comprise a termination shield electrode. The termination shield electrode may be formed between the first and second portions of the conductive material in the trench and may be connected to the source potential. The termination shield electrode is electrically isolated from the first and second portion of the conductive trench material by an insulative material.

According to yet another additional aspect of the present disclosure, a Schottky contact may be formed below the termination trench. A vertical connection may be formed that extends completely through the insulative material separating the first and second conductive portions of the termination trench. The vertical connection may then be in electrical contact with the drift region below the termination trench and the source metal.

Figure 1A:
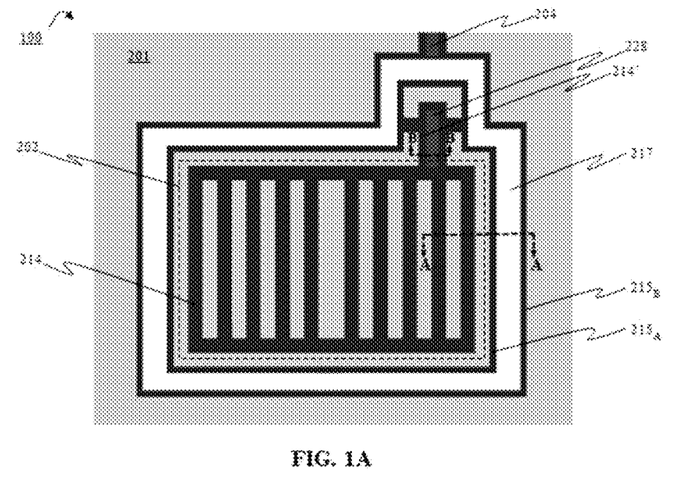
FIG. 1A is an overhead view of the layout of a die that may be used with the termination according to aspects of the present disclosure.

FIG. 1A is an overhead view of a device structure 100 that is formed on a semiconductor die 201. The device structure 100 includes an active area 202 surrounded by a termination trench. In the active area 202 the device trenches are shown. The device trenches are lined with a dielectric material (not shown) and filled with a conductive material to form gate electrodes 214. A gate pickup electrode 214' electrically connects to the gate electrodes 214 to the gate metal (not shown) with a gate contact 228. The gate electrodes 214 and gate pickups 214' may be made from the same material, e.g., polysilicon, which may be formed in corresponding trenches in a common step. The gate contact 228 may be formed with a conductive material such as tungsten. Gate contact 128 may extend perpendicular to the plane of the drawing to make electrical contact with the gate metal. The gate metal may be initially formed as part of the same metal layer as the source metal. The gate metal may be electrically isolated from the source metal, e.g., by masking, etching and dielectric fill processes, as are commonly done for this purpose.

The termination trench may include a first conductive material $215_A$ and a second conductive material $215_B$. The two portions may be electrically separated with an insulative material 217. By way of example, and not by way of limitation, the two conductive portions $215_A$ and $215_B$ may be formed from a polysilicon material. By way of example, the insulative material 217 may be an oxide. As shown, in FIG. 1A, the first conductive material $215_A$ may be electrically connected to the gate metal and the second conductive material $215_B$ may be electrically connected to the drain metal via a vertical drain contact 204. When the first conductive portion $215_A$ is connected to the gate electrode the outermost device in the active area 202 may be a fully functioning device. As such, the termination trench should be spaced apart from the outermost active device a distance equal to the spacing between each of the active devices. However, it should be noted that the first and second conductive materials $215_A$ and $215_B$ may be electrically floating.

Figure 2A:
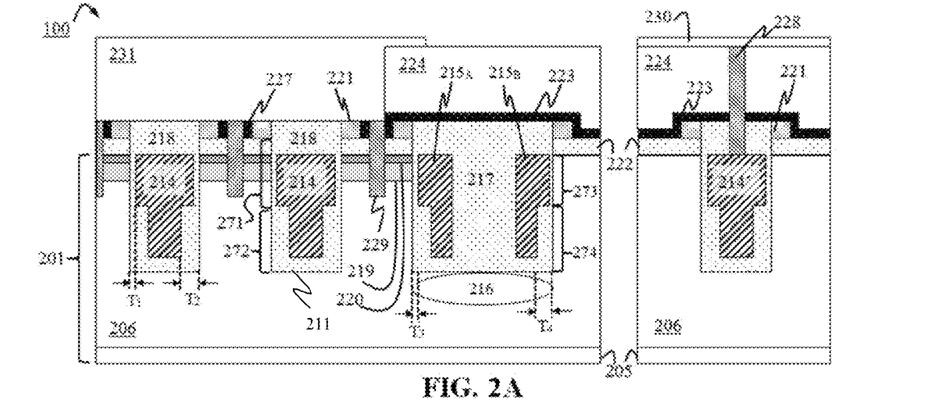
FIGS. 2A-2E are cross-sectional views of active device structures and the termination structure of the device die along line A-A shown in FIG. 1A and a gate pickup structure along the line B-B in FIG. 1A according to various aspects of the present disclosure.

FIG. 2A is a cross-sectional view of the device structure 100 along the lines A-A and B-B of FIG. 1A according to a first aspect of the present disclosure. The two cross-sections are located in different planes of device structure 100, but for simplicity, the two will be displayed side by side throughout the remainder of the application. The cross-section seen along line A-A will be shown on the left side of the page, and depicts the active device structures, and the termination trench structure. The cross-section B-B will be shown on the right side of the page and depicts the gate pickup structure.

Device structure 100 may be formed on a semiconductor substrate 201. Furthermore, a plurality of such devices 100 may be formed on the same substrate, as is common in semiconductor manufacturing. The substrate 201 may be suitably doped to be an N-type or a P-type substrate. By way of example, and not by way of limitation, the semiconductor substrate 201 may be an N-type silicon substrate. The semiconductor substrate may have a heavily doped $N^+$ drain region 205. By way of example, the drain region 205 may have a doping concentration of approximately $10^{19}$ cm$^{-3}$ or greater. The drain region 205 may be electrically connected to a drain electrode (not shown) formed on a bottom surface of the semiconductor substrate. Above the drain region 205 may be a lightly doped N drift region 206. By way of example, the drift region 206 may have a doping concentration that is approximately between about $10^{15}$ cm$^{-3}$ and about $10^{17}$ cm$^{-3}$. Above the drift region 206, a suitably doped body layer 219 of a second conductivity type that is opposite to the first conductivity type of the semiconductor substrate may be formed. A source region 220 of the first conductivity type may be formed in a top portion of the body layer 219. By way of example, and as used throughout the remainder of the disclosure, the semiconductor substrate 201 may be an N-type semiconductor, the body region 219 may be a P-type, and the source region 220 may be N-type.

According to aspects of the present disclosure, the active area 202 of the device structure 100 may comprise a plurality of trench based power MOSFETs. The trench based power MOSFETs are formed by creating a trench that extends through the P-body region 219 and into the drift region 206. Each trench may have an upper portion 271 and a bottom portion 272. A dielectric material 211 may line the walls of the trench. The dielectric material 211 may have a thickness $T_2$ in the bottom portion of the trench 272 and the dielectric material 211 may have a thickness $T_1$ in the upper portion of the trench 271. According to aspects of the present disclosure, the thickness $T_1$ is smaller than the thickness $T_2$. By way of example, the dielectric material 211 may be an oxide. The remainder of the trench may be filled with a suitable material to form a gate electrode 214. By way of example, the gate electrode 214 may be formed with polysilicon. The gate electrode 214 is electrically isolated from a source metal 229 by an insulative gate cap 218 which is disposed above the trench 210. An insulative layer 222 may also be formed above the source region 220. A first insulative spacer 221 may be disposed along each vertical edge of the insulative gate cap 218. By way of example, and not by way of limitation, the first insulative spacer 221 may be the same material as the insulative cap 218. By way of example and not by way of limitation, the insulative gate cap 218, the insulative layer 222, and the first insulative spacer 221 may be an oxide.

The source regions 220 are electrically connected to the source metal 231. By way of example and not by way of limitation, the connection may be made through the use of a vertical connection 229 which extends through the insulating layer 222. By way of example and not by way of limitation, the vertical connections 229 may be made from a conductive material such as tungsten. Some additional aspects of the present disclosure may also include a barrier metal (not shown) that lines the vertical connections 229. The barrier metal may be useful to prevent unwanted diffusion. By way of example, and not by way of limitation, the barrier metal may be titanium or titanium nitride.

Additionally, a second insulative spacer 227 may separate the vertical connection 229 from the first insulative spacer 221. By way of example, and not by way of limitation, the first insulative spacer 221 may be made of a material that will resist an etchant that selectively removes the material that the second insulative spacer 227 is made from. By way of example, the first insulative spacer 221 may be an oxide, and the second insulative spacer 227 may be a nitride. The oxide is resistant to a hot phosphoric acid, while the nitride would be selectively etched away by the hot phosphoric acid. Additionally, the first and second insulative spacers 221, 227 may be made from the same insulative material, such as a nitride. The first and second insulative spacers 221, 227 allow for the vertical connections 229 to be self-aligned. The use of the existing self aligned structures on device 100 instead of employing a contact mask in order to form the vertical connections 229 for the source contacts minimizes possible error due to misalignment.

In cross-section A-A a termination trench structure is also depicted according to an aspect of the present disclosure. The width of the termination trench is wider than the width of the active device structures. The width of the termination trench should be chosen such that when the device trenches are filled with the trench filling material 214, the trench filling material will only line the sidewalls and bottom of the termination trench. By way of example, and not by way of limitation, the termination trench may be at least twice as wide as the device trenches, e.g., if the device trenches are approximately 0.5 microns wide, then the termination trench may be approximately 1.0 microns wide or greater. Each termination trench may have an upper portion 273 and a bottom portion 274. A dielectric material 211 may line the walls of the termination trench. The dielectric material 211 may have a thickness $T_4$ in the bottom portion of the trench 274 and the dielectric material 211 may have a thickness $T_3$ in the upper portion of the trench 273. According to aspects of the present disclosure, the thickness $T_3$ is smaller than the thickness $T_4$. According to additional aspects of the present disclosure, the thickness $T_3$ may be approximately equal to the thickness $T_1$, and the thickness $T_4$ may be approximately equal to the thickness $T_2$. The trench filling material that lines the side wall of the termination trench closer to the active region 102 may be referred to as the first portion of the conductive material $215_A$ and the trench filling material that lines the wall of the termination trench that is further from the active region 102 may be referred to as the second portion of the conductive material $215_B$.

The first and second portions of the conductive material $215_A$, $215_B$ are electrically isolated from each other by a termination trench insulator 217. By way of example, the termination trench insulator 217 may be an oxide. A first insulative spacer 221 may be disposed along each vertical edge of the trench insulator 217 above the insulative layer 222. By way of example, and not by way of limitation, the first insulative spacer 221 may be the same material as the trench insulator 217. Additionally, a second insulative layer 223 may be formed above the termination trench insulator 217 and along the exposed sidewalls of the first insulative spacer. By way of example, and not by way of limitation, the first insulative spacer 221 may be made of a material that will resist an etchant that selectively removes the material that the second insulative layer 223 is made from. By way of example, the first insulative spacer 221 may be an oxide, and the second insulative layer 223 may be a nitride. The oxide is resistant to a hot phosphoric acid, while the nitride would be selectively etched away by the hot phosphoric acid. Additionally, the first insulative spacer 221 and the second insulative layer 223 may be made from the same insulative material, such as a nitride. The combination of the first insulative spacer 221 and the second insulative layer 223 that is formed along the exposed sidewall of the first insulative spacer 221 that is closest to the active device region 202 allows for a vertical connections 229 to be self-aligned between the outermost active device and the termination trench. An outer insulator 224 may be formed above the second insulative layer 223. By way of example, and not by way of limitation, the outer insulator 224 may be BPSG.

According to aspects of the present disclosure, the first portion of the conductive material $215_A$ may be electrically connected to the gate potential, and the second portion of the conductive material $215_B$ may be electrically connected to the drain potential. As shown in FIG. 1A, the first portion of the conductive material $215_A$ is connected to the gate pickup trench, and the second portion of the conductive material $215_B$ is connected to the drain contact. According to additional aspects of the present disclosure, the first and second portions of conductive material $215_A$, $215_B$ may be electrically floating, i.e., they are not maintained at a source, gate, or drain potential. Alternatively, the first portion of conductive material $215_A$ may be maintained at gate potential, and the second portion of conductive material $215_B$ may be electrically floating. It may be desirable to maintain the first portion of conductive material $215_A$ at gate potential, because then the outermost active device in the active region 102 may still be a fully functioning device.

According to yet another additional aspect of the present disclosure, an electrical field line tuning region 216 may be optionally formed beneath the termination trench. The electrical field line tuning region 216 may be formed by doping the semiconductor substrate 201 below the termination trench 213 with a P-type dopant, such as boron. The implantation dose may be adjusted to further control the distribution of the electrical field lines present at the termination trench. For example, boron can be implanted with a dose in a range of 2e11 to 5e12 atoms/cm$^2$ at an energy of about 30 to 80 KeV.

The gate pickup structure shown in portion B-B of FIG. 2A is formed by creating a gate pickup trench that is substantially similar to the active device trenches. Additionally, a second insulative layer 223 may be formed over the top surface of the insulative cap 218 and along the top surface of the first insulative spacer 221 and along the exposed side surfaces of the first spacer 221. An outer insulator 224 may be formed above the second insulative layer 223. By way of example, and not by way of limitation, the outer insulator 224 may be BPSG. The conductive trench filling material in the pickup trench may be called the gate pickup electrode 214'. The gate pickup electrode 214' may be electrically connected to a gate metal 230. By way of example and not by way of limitation, the connection may be made through the use of a vertical gate contact 228 which extends through the outer insulator 224, the second insulative layer 223, and the insulative cap 218. By way of example and not by way of limitation, the vertical connection 228 may be made from a conductive material such as tungsten. According to some aspects of the present disclosure, the vertical connection 228 may be lined with a barrier metal (not shown) such as titanium, or a titanium nitride.

Figure 2B:
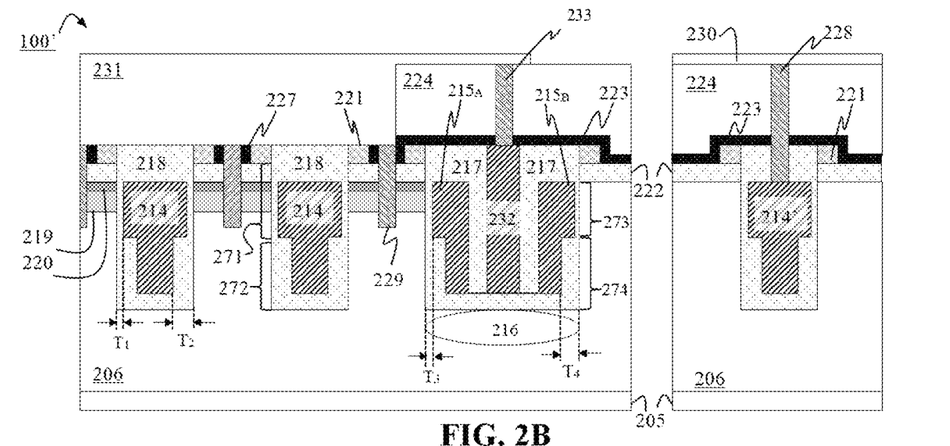

FIG. 2B depicts a device 100' according to an additional aspect of the present disclosure. The active device structures and the gate pickup structure is substantially similar to the device depicted in FIG. 2A. Device 100' includes a conductive termination shield electrode 232 in the termination trench structure. The shield electrode 232 is formed between the first portion of conductive material $215_A$ and the second portion of conductive material $215_B$. The shielding portion may be the same material as the first and second portions of the conductive material $215_A$, $215_B$. By way of example the shielding portion 232 may be polysilicon. The shielding portion is electrically isolated from the first and second portions of the conductive material $215_A$, $215_B$ by the termination trench insulator 217. Additionally, the shielding portion 232 may be electrically connected to the source metal 231. By way of example and not by way of limitation, the connection may be made through the use of a vertical gate contact 233 which extends through the outer insulator 224 and the second insulative layer 223. By way of example and not by way of limitation, the vertical connection 233 may be made from a conductive material such as tungsten. According to some aspects of the present disclosure, the vertical connection 233 may be lined with a barrier metal (not shown) such as titanium, or a titanium nitride. The shielding portion improves the breakdown voltage of the device 100'.

Figure 2C:
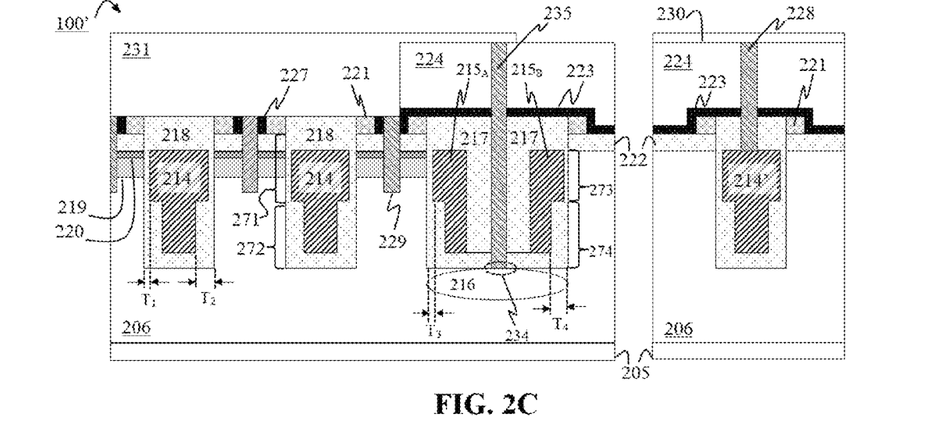

FIG. 2C depicts a device 100" according to another additional aspect of the present disclosure. The active device structures and the gate pickup structure are substantially similar to the device depicted in FIG. 2A. Device 100" includes a Schottky contact 234 in the termination trench structure. In addition to the first and second portions of conductive material 215$_A$, 215$_B$, a vertical connection 235 may be electrically connected to the source metal 231 and extend through the outer insulator 224, the second insulative layer 223, the trench insulator 217, and the dielectric material 211, thereby connecting the source metal 231 to the drift region 206 and/or the field tuning region 216 below the termination trench structure.

According to additional aspects of the present disclosure, devices 100, 100', and/or 100" may incorporate an electrostatic discharge (ESD) device and/or a Schottky contact. The incorporation and fabrication of these additional features into devices with similar active cells is described in detail in commonly owned U.S. patent application Ser. No. 13/724,228, filed Dec. 21, 2012, titled "HIGH DENSITY TRENCH-BASED POWER MOSFETS WITH SELF-ALIGNED ACTIVE CONTACTS AND METHOD FOR MAKING SUCH DEVICES", to Lee et al., and which is incorporated herein in its entirety.

Figure 2D:
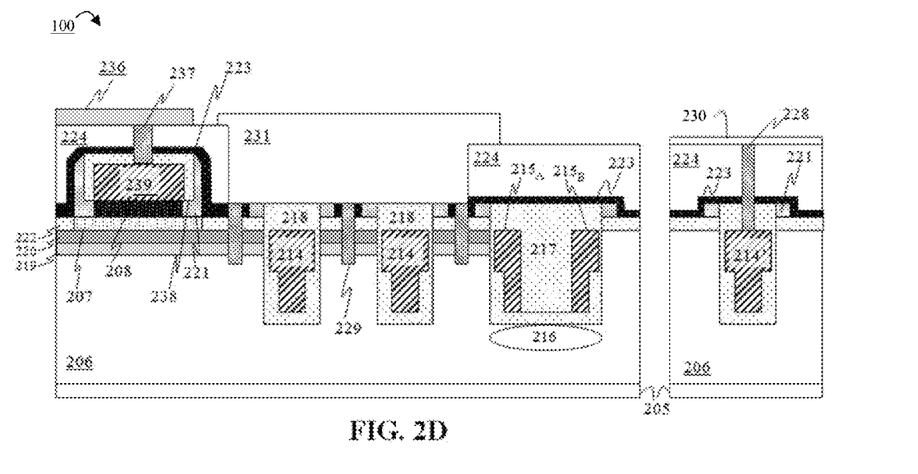

In FIG. 2D a device 100 further includes an ESD structure. The ESD protection feature may be formed above the insulative layer 207. A nitride layer 208 may be disposed on the top surface of the insulative layer 207. Above the nitride layer 208, an ESD electrode 239 may be formed. By way of example and not by way of limitation the ESD electrode 239 may be formed with polysilicon. The ESD electrode 239 is substantially shielded along all surfaces except the bottom surface by an ESD insulation cap 238. By way of example, the ESD insulation cap 238 may be an oxide. First insulative spacers 221 may also be formed along the sides of the ESD insulation cap 238 and along the sides of the nitride layer 208. A second insulative layer 223 may be formed around the first insulation spacer 221 and over the top surface of the ESD insulation cap 238. An outer insulator 224 may be formed around the second insulative layer 223. By way of example, and not by way of limitation, the outer insulator 224 may be borophosphosilicate glass (BPSG). The ESD electrode 239 is electrically connected to an ESD metal 236. By way of example and not by way of limitation, the connection may be made through the use of a vertical connection 237 which extends through the outer insulator 224, the second insulative layer 223, and the ESD insulation cap 238. By way of example and not by way of limitation, the vertical connection 237 may be made from a conductive material such as tungsten. According to some aspects of the present disclosure, the vertical connection 237 may be lined with a barrier metal (not shown) such as titanium, or a titanium nitride.

Figure 2E:
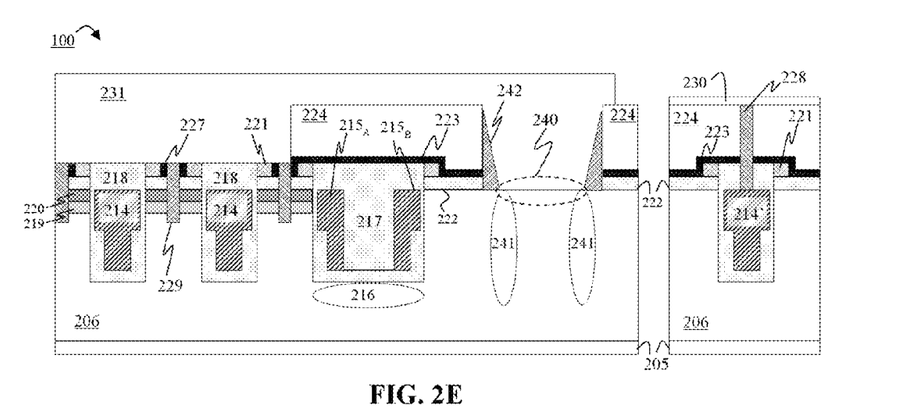

In FIG. 2E the device 100 further includes a Schottky contact 240 where the source metal 231 contacts the substrate. The external Schottky contact 240 may be formed outside of the termination trench structure. Additionally, the external Schottky contact may comprises one or more body clamp (BCL) regions 241 configured to prevent the active devices from operating above their breakdown voltages. As such the depth of the BCL regions 241 need to be designed such that the Schottky breakdown voltage for such regions is higher than the active device breakdown voltage. In an N-type semiconductor substrate, P-type dopants are implanted into the substrate 101 to form the BCL regions 241. By way of example, and not by way of limitation, the dopants may be introduced with one or more implantation processes with the use of an ion implantation system. The dopants may be implanted with voltages ranging between 10 keV and 500 keV. Some aspects of the present disclosure include metal contacts 242, which may be remnants from a prior processing step that formed the vertical connections 228 and/or 229. By way of example, and not by way of limitation, the metal contacts 242 may be tungsten. According to some aspects of the present disclosure, a barrier metal (not shown) such as titanium, or a titanium nitride may be deposited between the source metal 231 and the semiconductor substrate 201 at the Schottky contact 240.

Figure 1B:
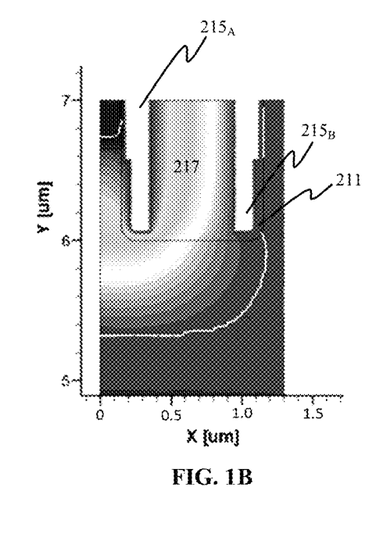
FIG. 1B is a cross-sectional view of the termination structure shown in FIG. 1A that illustrates the voltage potential.
Figure 1C:
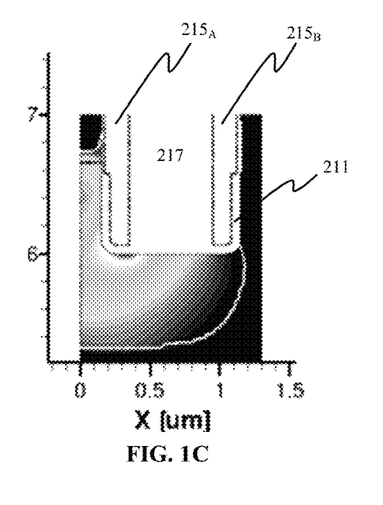
FIG. 1C is cross-sectional views of the termination structure shown in FIG. 1A that illustrates the electrical field plots in each region.

The benefits of using a termination trench similar to those described in the present application are shown in FIG. 1B, which depicts the voltage potential contours (the darker regions are closer to the drain potential). As may be seen, the termination trench allows for the voltage potential to be spread near the edge of the device. Additionally, FIG. 1C depicts the reduction of the absolute electrical field (V/cm) near the termination trench.

Figure 3A:
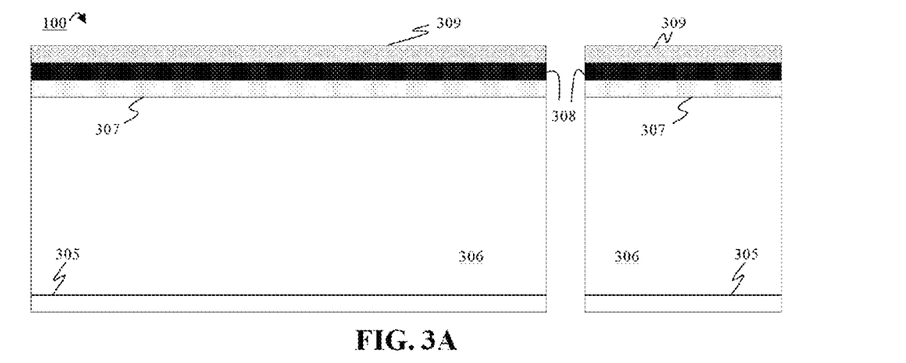
FIGS. 3A-3N depict a method for forming a termination trench shown in FIG. 2A according to an aspect of the present disclosure.
Figure 3B:
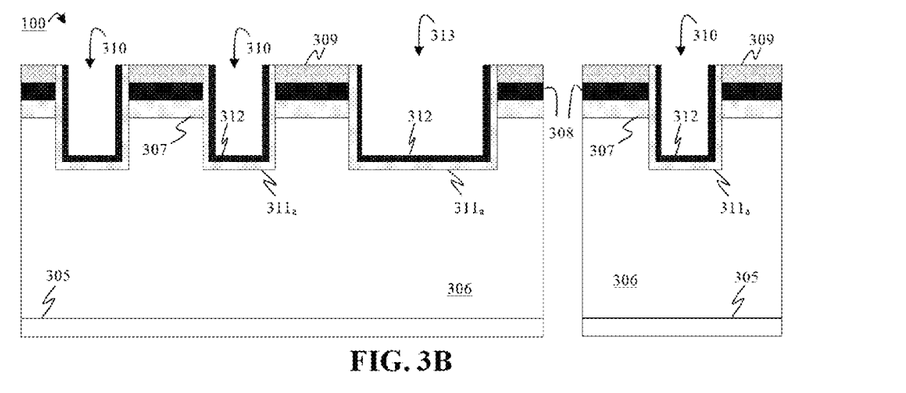
Figure 3C:
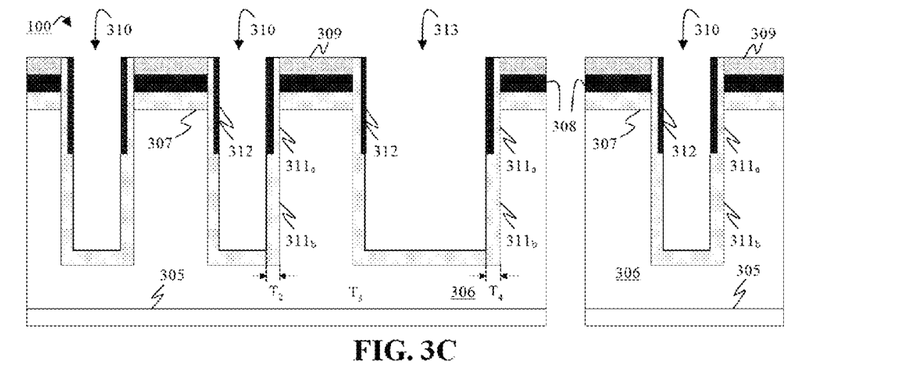
Figure 3D:
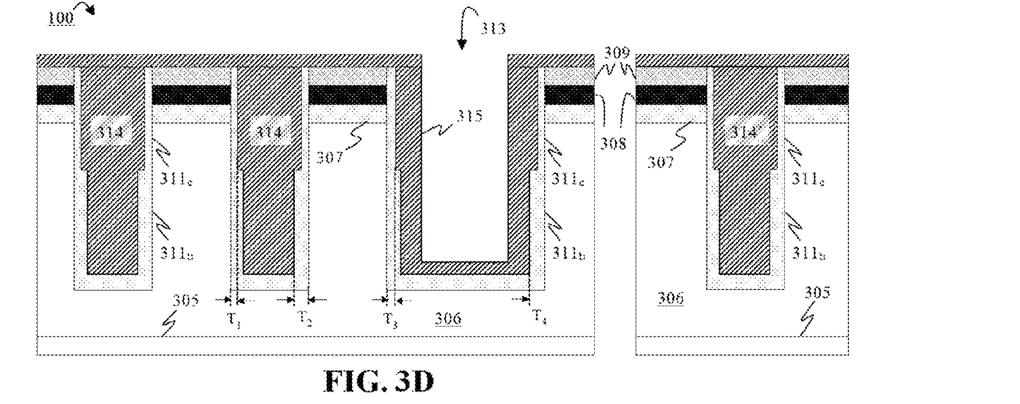
Figure 3E:
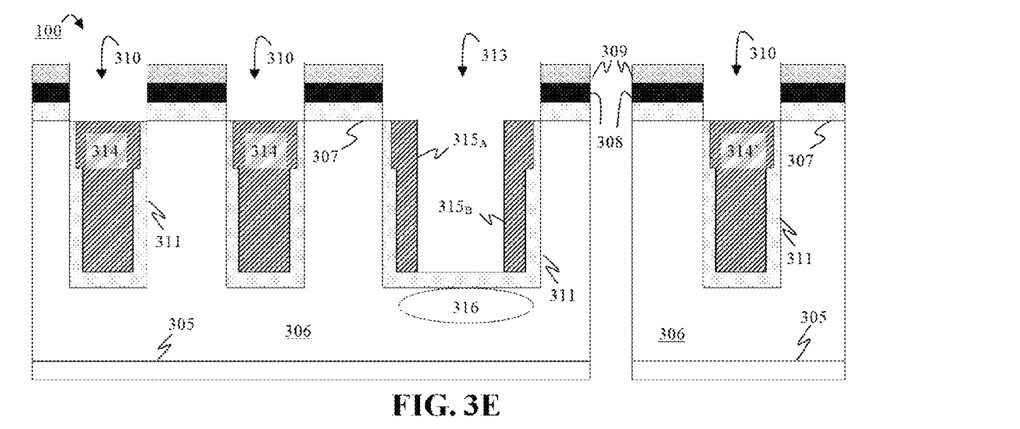
Figure 3F:
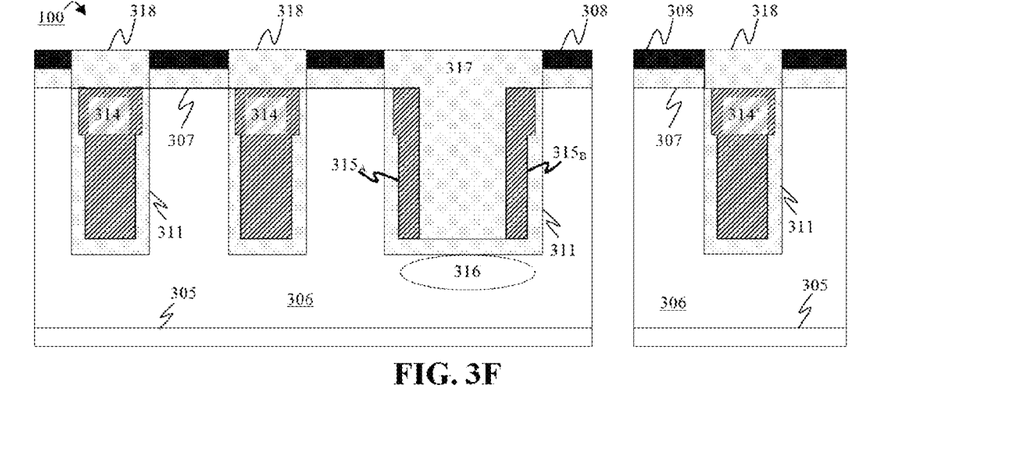
Figure 3G:
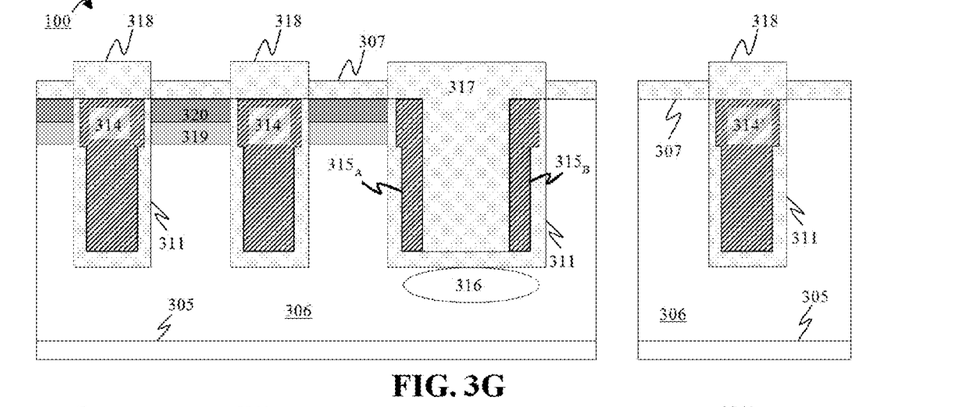
Figure 3H:
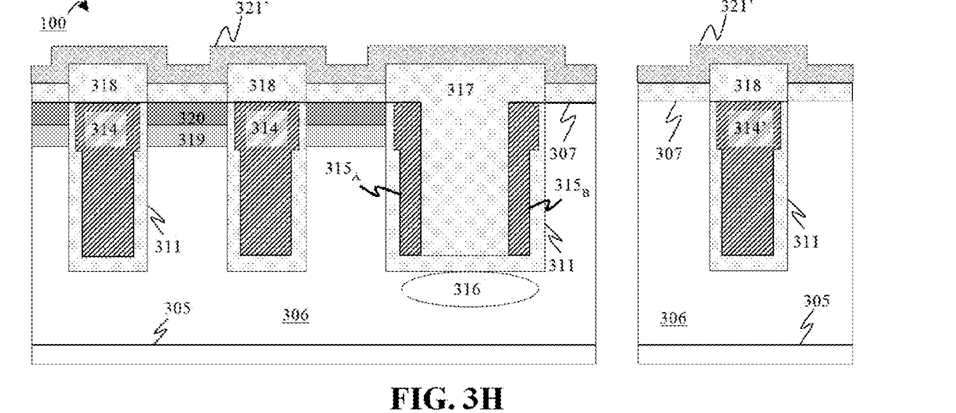
Figure 3I:
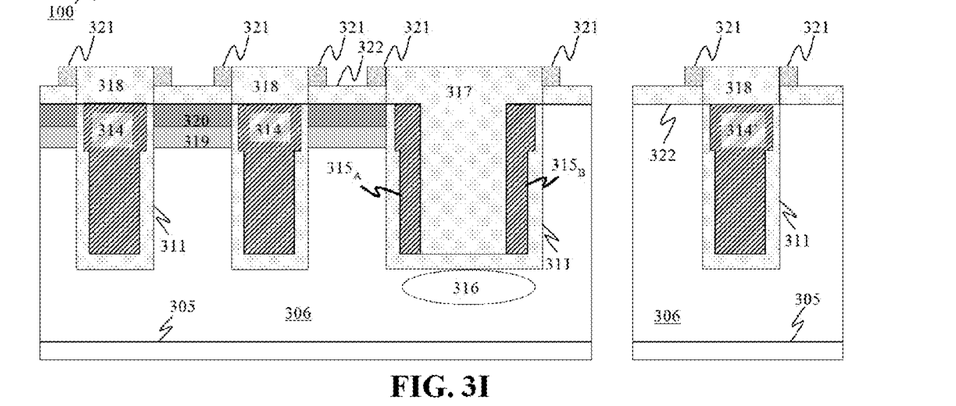
Figure 3J:
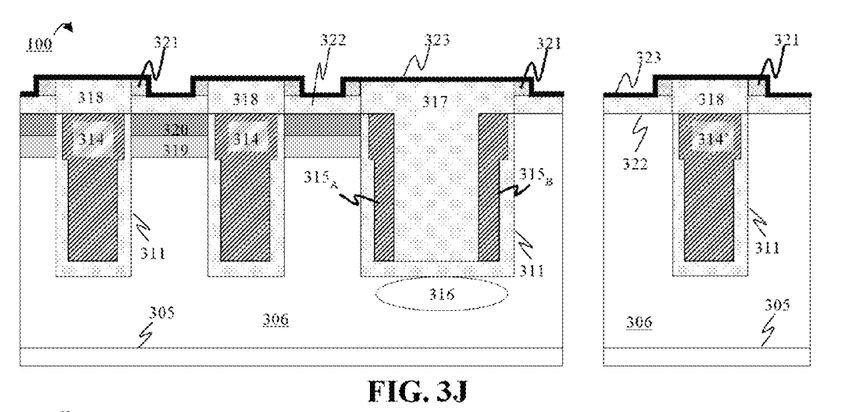
Figure 3K:
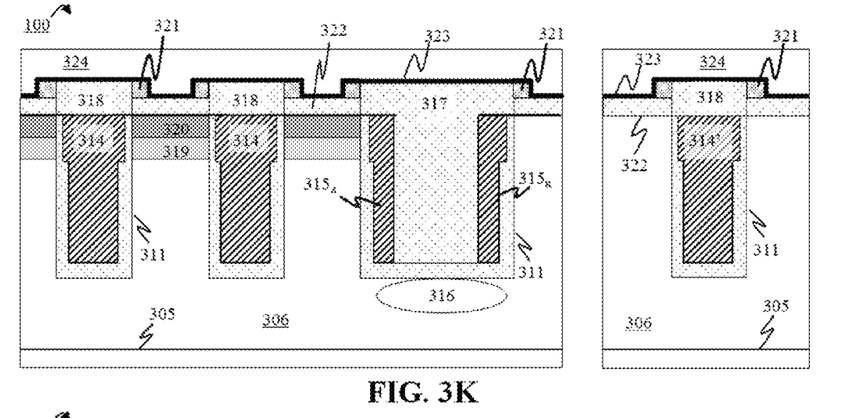
Figure 3L:
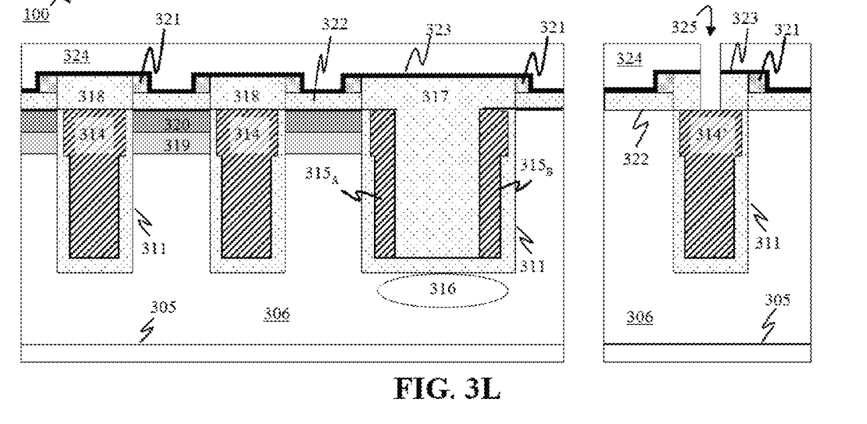
Figure 3M:
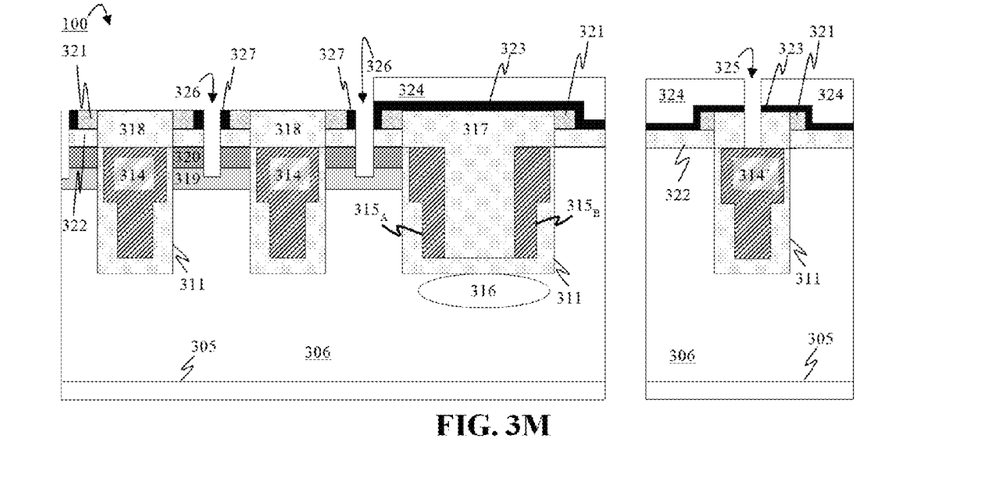
Figure 3N:
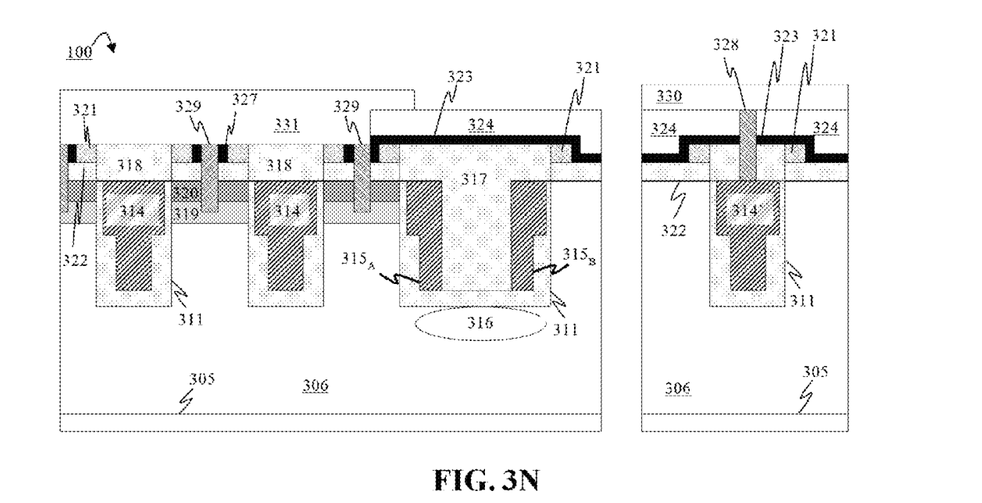

FIGS. 3A-3N depict a method for forming a device 100 according to an aspect of the present disclosure.

FIG. 3A depicts a semiconductor device structure 100. The device structure may be formed on a substrate that may be suitably doped to be an N-type or a P-type substrate. By way of example, and not by way of limitation, the semiconductor substrate may be an N-type silicon substrate. As used herein, the substrate of device structure 100 will be described as an N-type silicon substrate. The semiconductor substrate may comprise a lightly doped drift region 306 formed in an upper portion of the substrate and a heavily doped drain contact region 305 formed on a bottom portion of the semiconductor substrate. An oxide-nitride-oxide (ONO) hard mask layer may be formed on a top of the lightly doped drift region 306. By way of example and not by way of limitation, the bottom oxide layer 307 may be approximately 200 Å, the nitride layer 308 may be 3500 Å, and the top upper oxide layer 309 may be 1400 Å.

FIG. 3B depicts the device structure 100 after several initial processing steps. First, a trench mask and etching process may be used to form an upper portion of the trenches 310 and 313. A trench etching process may comprise an etchant to remove the ONO hard mask layer 307, 308, 309, in order to expose the top surface of the substrate and a second etching process to form the upper portion of trenches 310 and 313. By way of example, and not by way of limitation, the upper portion of trenches 310 and 313 may be approximately 0.5 μm deep. Trenches 310 are formed in the active region of the device structure 100 in order to form the active device, and outside the active region in order to form a gate pickup. Termination trench 313 may be formed outside of the active region in order to form the termination trench. The termination trench 313 may be wider than the trenches 310. The width of the termination trench 313 should be chosen such that the trenches 310 will completely fill with a conductive material during a subsequent trench filling process, whereas the same trench filling process will only cause the termination trench 313 to be lined with the conductive material. By way of example, and not by way of limitation, the termination trench 313 may be twice as large as the trenches 310. Once the trenches have been formed, a pad oxide 311$_a$ may be thermally grown in each trench 310, 313 that is approximately 100 Å thick. After the pad oxide $311_a$ has been grown, a nitride layer 312 may be deposited over the pad oxide $311_a$. By way of example, and not by way of limitation, the nitride layer 312 may be approximately 500 Å thick.

FIG. 3C depicts the formation of the bottom portion of the trenches. First, the nitride layer 312 and the oxide layer $311_a$ on the bottom surface of the trench may be removed with one or more etching processes. Thereafter, the drift region 306 below the upper portion of the trenches may be etched to increase the depth of the trenches 310, 313. By way of example, and not by way of limitation, the combined depth of the upper and bottom portions of the trenches 310, 313 may be approximately 1.0 μm. Thereafter, a liner oxide $311_b$ is thermally grown in the exposed silicon at the bottom portion of the trenches. By way of example, the liner oxide $311_b$ in the bottom portion of the trenches 310 may be grown to a thickness $T_2$ that is approximately 600 Å. By way of example, and not by way of limitation, the liner oxide $311_b$ in the bottom of the trenches 313 may be grown to a thickness $T_4$ that is approximately 600 Å. The thicknesses $T_2$ and $T_4$ may be similar or the same. The nitride layer 312 along the walls of the upper portion of the trench functions as a mask, and reduces the width of the bottom portion of the trench.

In FIG. 3D the nitride 312 and the pad oxide $311_a$ at the side wall of the upper portion of the trench are then removed by a wet dip. Then a gate oxide $311_c$ is grown on the exposed silicon at the side wall of the upper portion of the trenches 310 to a desired thickness $T_1$, and a trench oxide $311_c$ may be grown along the sidewalls of the upper portion of the termination trench 313 to a desired thickness $T_3$. The thicknesses $T_1$ and $T_3$ may be similar or the same. By way of example, and not by way of limitation, the thicknesses $T_1$ and $T_3$ of the oxide $311_c$ may be approximately 265 Å for a 12V device. Therefore, the oxides 311 may have a thickness $T_2$ or $T_4$ in the bottom portion of the trench that is larger than the thickness $T_1$ or $T_4$ of the upper portion of the trench. While the above description describes a thickness of the oxide 311 as being variable with respect to depth in the trench, it is within the scope of the present disclosure to have a uniform gate oxide thickness 311.

Next, in FIG. 3D the trenches 310 are filled with a conductive material in order to form the gate electrode 314, and the gate pickup electrode 314'. By way of example, and not by way of limitation, conductive material may be an N+-doped polysilicon, and the polysilicon may be deposited through chemical vapor deposition (CVD). During the trench filling process the termination trench 313 is also partially filled with conductive material. Since the termination trench 313 is wider than the trenches 310, the conductive material 315 in the termination trench 313 will only line bottom portion and the side walls.

In FIG. 3E excess polysilicon may be removed and the electrodes 314, 314', and 315 may be planarized with the surface of the hard mask using chemical mechanical polishing (CMP). Next, as shown in FIG. 3E, the electrodes 314, 314', and 315 may be etched back to the surface of the semiconductor substrate. By way of example and not by way of limitation, the etching may be performed with a dry etching process. During this process, the conductive material 315 lining the bottom portion of the termination trench 313 may also be removed, thereby forming two separate portions of conductive termination trench material $315_A$ and $315_B$. Additionally, a field line tuning region 316 may be formed below the termination trench 313 after the conductive material 315 at the bottom of the termination trench 313 has been removed. The field line tuning region 316 may be formed by implanting dopants of the conductivity type opposite that of the drift region 306. By way of example, and not by way of limitation, boron can be implanted with a dose in a range of 2e11 to 5e12 atoms/cm$^2$ at an energy of about 30 to 80 KeV.

In FIG. 3F an insulative cap 318 is formed over each of the electrodes 314, 314' by using the ONO hardmask as a self-aligning mask. The use of a self-aligned mask for the insulative caps 318 reduces the possibility of misalignment when the pitch of active devices is scaled to the deep sub-micron level. By way of example, and not by way of limitation, the insulative cap may be an oxide. During the formation of the insulative caps 318, the termination trench 313 is also filled with the insulative material 317. The insulative material 317 electrically separates the first and second portions of the conductive termination trench material $315_A$ and $315_B$. Once the insulative caps 318 and the termination trench insulative material 317 have been formed, the top oxide layer 309 of the ONO hardmask may be removed by CMP. The insulative caps 318 and the termination trench insulative material 317 may also be planarized with the nitride layer 308 with CMP.

In FIG. 3G the nitride layer 308 of the ONO hardmask may be removed. By way of example, the hardmask may be selectively removed with a hot-phosphoric acid wet dip. Thereafter, the body region 319 may be formed. By way of example, and not by way of limitation, the body region 319 may be formed with a body mask and a blanket implantation, or through selectively implanting ions with an ion implantation system. FIG. 3G also shows the formation of the source region 320. By way of example, and not by way of limitation, the source region 320 may be formed with a source mask and a blanket source implantation, or through selectively implanting ions with an ion implantation system. The gate pickup region and the portion of the device structure outside of the termination trench 313 may be blocked from receiving the body implant and the source implant.

FIG. 3H depicts the deposition of a thick sacrificial insulation layer 321'. By way of example, the sacrificial insulation layer may be 1,100 Å thick. Further by way of example, the insulation layer 321' may be an oxide deposited by CVD with a source gas such as TEOS. Alternatively, the insulation layer 321' may be a nitride material that is deposited with a CVD process using a $SiH_4$ and $NH_3$ gas mixture. Next, in FIG. 3I the thick insulation layer 321' may be etched using an anisotropic etch, such as a dry etching process, in order to form the first insulating spacers 321 on the side of each insulating cap 318, and along the sides of the termination trench insulative material 317. By way of example, the insulation spacers 321 may be 1000 Å thick. When the insulation layer 321' is an oxide, the etching process may stop on the silicon substrate's surface, thus removing portions of the bottom oxide layer 307 from the ONO hardmask that are not located below the first insulating spacers 321. A pad oxide 322 may then be grown over the surface of the substrate. By way of example, and not by way of limitation, the pad oxide 322 may be 100 A thick.

Alternatively, a similar process may be used for forming the first insulating spacers 321 in a device that utilizes a sacrificial insulation layer 321' that is a nitride material. In this situation the anisotropic etching process may selectively etch away the nitride material and leave the bottom oxide layer 307 of the ONO hardmask in place. As such, there is no need to grow the pad oxide 322. Once the first insulating spacers 321 have been formed, the processing of a device that has first insulating spacers that are made from a nitride material would then continue in substantially the same manner as that described for a process where the first insulating spacers 321 are made from an oxide.

After the first insulating spacers 321 have been formed, a sacrificial nitride layer 323 may be deposited over the surface as shown in FIG. 3J. By way of example, the nitride layer 323 may be 300 Å thick. The nitride layer 323 may be deposited with a CVD process using a SiH₄ and NH₃ gas mixture. As shown in FIG. 3K, a thick layer of borophosphosilicate glass (BPSG) 324 may then be deposited over the nitride layer 323 with a CVD process.

A contact mask may be used in FIG. 3L to form a contact trench 325 that provides access for conductive vertical connections to reach the gate pickup electrode 314'. The etching process may utilize three separate etching steps. First, an etchant may be used that will remove the BPSG layer 324 and will not remove the nitride layer 323 below the BPSG. This allows for a fast etch, since there is no chance of over etching due to the nitride stop layer 323. A second etchant may then be used to selectively etch through the nitride layer 323. Thereafter, a third etchant may be used that has a high selectivity for oxide in order to break through the insulative cap 318 for the gate pickup electrode 314'.

In FIG. 3M a layer of photoresist (not shown) may be deposited and a second contact mask may be utilized to expose the active cell region. Thereafter, a first etching process may selectively remove the BPSG layer 324 over the active region. A second anisotropic etching process, such as a dry etching process, may selectively remove the sacrificial nitride layer 323. Due to the directional selectivity of the anisotropic etch, portions of the sacrificial nitride layer 323 remain after the etching. The remnants of the sacrificial nitride layer 323 become the second insulative spacer material 327. The second insulative spacer material 327 self-aligns the contact trenches 326. Self-aligning the source contacts allows for enhanced scalability because it reduces the chances of misalignment. The next etching process removes the reaming oxide layer 322, and finally, the semiconductor substrate is etched in order to allow a contact to be made with the source and body regions through the self-aligned contact trenches 326.

FIG. 3N depicts the final processing steps for the device structure 100. First a barrier metal (not shown) may be deposited over the entire surface. The barrier metal prevents diffusion into the source region 320. By way of example, and not by way of limitation, the barrier metal may be titanium that is deposited through physical vapor deposition (PVD), or it may be an alloy such as TiN which may be deposited by CVD or PVD. After the barrier metal has been deposited, a conductive material may be deposited in order to form the vertical connections 328 and 329. By way of example, and not by way of limitation, the vertical connections may be made tungsten that is deposited by CVD. Once the layer of tungsten has been deposited, it may be etched back in order to leave the tungsten primarily in the vertical contact holes. Metal may then be deposited over the entire surface to provide appropriate contacts to the vertical connections 328 and 329. By way of example, and not by way of limitation, the deposited metal may be sputtered aluminum. Finally, a metal mask may be used to etch away portions of the deposited metal in order to electrically isolate the contact areas into a source metal 331, and a gate metal 330.

Figure 4A:
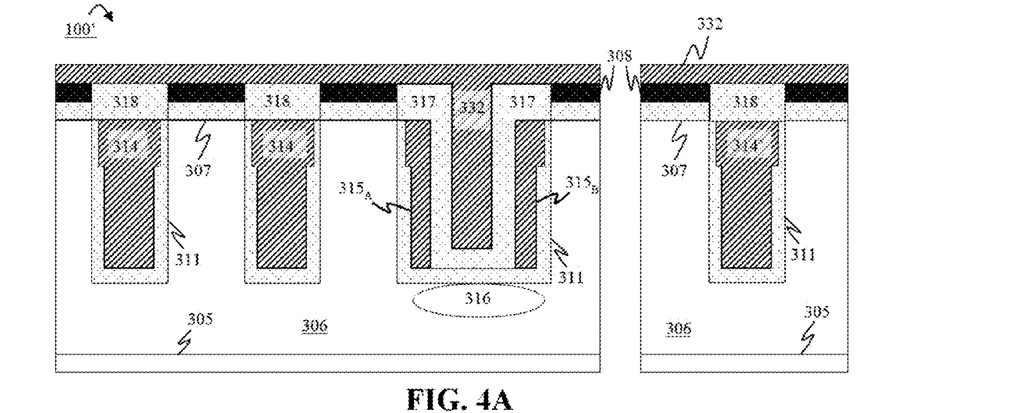
FIGS. 4A-4C depict additional steps that may be used in a method for forming a termination trench shown in FIG. 2B according to an aspect of the present disclosure.
Figure 4B:
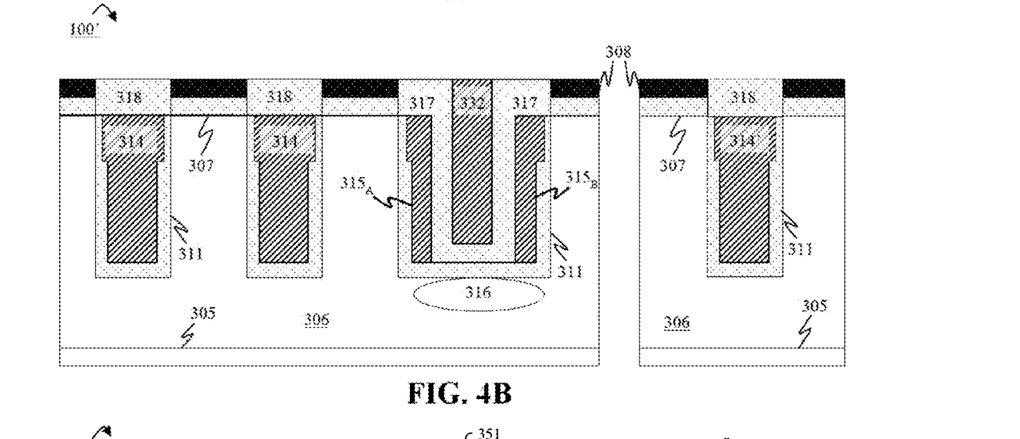
Figure 4C:
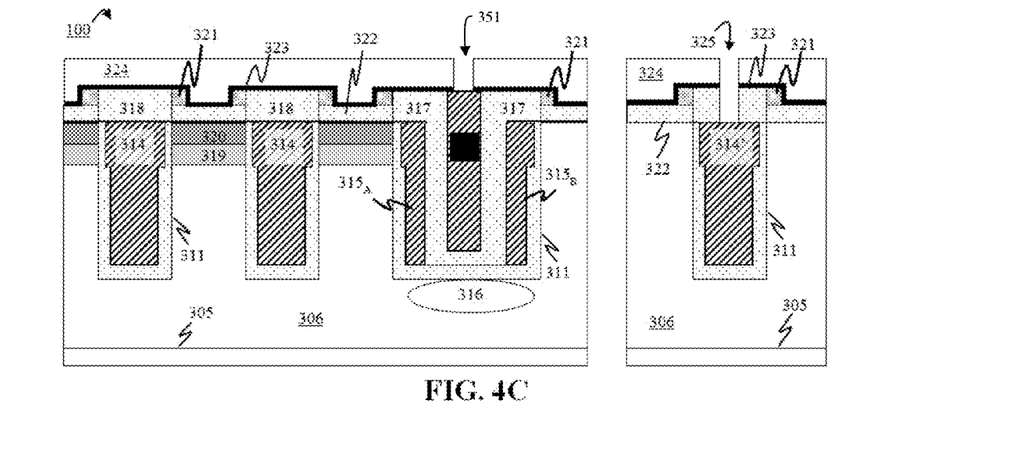

FIGS. 4A-4C depict additional steps that may be utilized in order to form device 100' that is shown in FIG. 2B. Device 100' follows the same processing flow described in FIGS. 3A-3E. Instead of completely filling the termination trench 313 with insulative material 317, as shown in FIG. 3F, only enough insulative material 317 is deposited to line the exposed sidewalls of the first and second portions of the conductive material $315_A$ and $315_B$, and the bottom of the trench above the oxide layer 311. Thereafter, conductive material is deposited into the trench 313 to form a shield electrode 332. By way of example, the shield electrode 332 may be polysilicon. The insulative trench material 317 electrically isolates the shield electrode 332 from both the first and second portions of conductive material in the trench 313. Next in FIG. 4B, the excess conductive material is removed through an etching process, thereby leaving the top surface of the shield electrode 332 coplanar with the top surface of the insulative trench material 317. The processing then continues according to processing that is substantially similar processing to the processing for device 100, until the first contact mask is applied. The first contact mask for device 100' is shown in FIG. 4C. As may be seen, an additional trench 350 is formed above the shield electrode 332 that passes through the insulative material 324 and 323. Thereafter, the processing continues according to that of device 100, in which a vertical connection 233 is formed that connects the shield electrode to the source metal 324 as shown in FIG. 2B.

Figure 5:
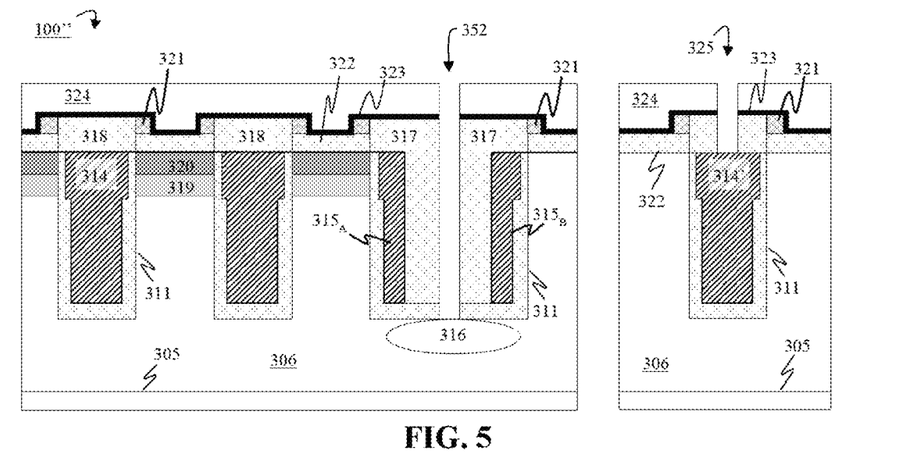
FIG. 5 depicts an alternative step that may be used in a method for forming a termination trench shown in FIG. 2C according to an aspect of the present disclosure.

The device 100" shown in FIG. 2C may be formed by following substantially the same processing described for device 100 until the first contact mask is used. FIG. 5 depicts how a trench 352 is formed completely through the termination trench 313. This provides access for a vertical connection 235 to be formed that connects the source metal 231 to the drift region 306 and/or the field line tuning region below the termination trench 313 in subsequent metallizing steps, that are substantially similar to those used for device 100.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device comprising:
an active device region containing a plurality of active devices; and
a termination structure that surrounds the active device region, wherein the termination structure includes a first conductive region that surrounds the active device region, an insulator region that surrounds the first conductive region, and a second conductive region that surrounds the first conductive region and the insulator region,
wherein the active device region and termination structure are formed into a semiconductor material of a first conductivity type,
wherein the first conductive region is electrically connected to a gate metal and the second conductive region is connected to a drain metal; and
a termination shield formed between the first and second conductive regions, wherein the termination shield is electrically isolated from the first and second portions of conductive material, and wherein the termination shield is maintained at a source potential.

2. The semiconductor device of claim 1, wherein the first and second conductive regions and the insulating region are formed in a common trench in the semiconductor material that surrounds the active region.

3. A semiconductor device comprising:
- an active device region containing a plurality of active devices; and
- a termination structure that surrounds the active device region, wherein the termination structure includes a first conductive region that surrounds the active device region, an insulator region that surrounds the first conductive region, and a second conductive region that surrounds the first conductive region and the insulator region,
- wherein the active device region and termination structure are formed into a semiconductor material of a first conductivity type,
- wherein the first conductive region is electrically connected to a gate metal and the second conductive region is connected to a drain metal; and
- a Schottky contact formed below the termination structure.

4. The semiconductor device of claim 3, wherein the first and second conductive regions and the insulating region are formed in a common trench in the semiconductor material that surrounds the active region.

5. A semiconductor device comprising:
- an active device region containing a plurality of active devices; and
- a termination structure that surrounds the active device region, wherein the termination structure includes a first conductive region that surrounds the active device region, an insulator region that surrounds the first conductive region, and a second conductive region that surrounds the first conductive region and the insulator region,
- wherein the active device region and termination structure are formed into a semiconductor material of a first conductivity type,
- wherein the first conductive region is electrically connected to a gate metal and the second conductive region is connected to a drain metal, wherein the first and second conductive regions and the insulating region are formed in a common trench that surrounds the active region, and wherein a dielectric material lining an upper portion of sidewalls of the common trench is a first thickness, and a dielectric material lining a lower portion of the sidewalls of the common trench is a second thickness, wherein the second thickness is greater than the first thickness.

6. The semiconductor device of claim 5, further comprising:
- a source layer of a second conductivity type formed in an upper portion of the semiconductor material bounded by an outermost active semiconductor device of the plurality and the termination trench; and
- a body layer of the first conductivity type formed below the source layer.

7. The semiconductor device of claim 6, wherein a distance between the outermost active semiconductor device and the termination trench is equal to a distance separating each of the active semiconductor devices from each other.

8. The semiconductor device of claim 5, further comprising an electrical field line tuning region of the second conductivity type formed below the termination structure.

9. The semiconductor device of claim 5, wherein the termination structure further surrounds a gate pickup feature.

10. A semiconductor device comprising:
- an active device region containing a plurality of active devices; and
- a termination structure that surrounds the active device region, wherein the termination structure includes a first conductive region that surrounds the active device region, an insulator region that surrounds the first conductive region, and a second conductive region that surrounds the first conductive region and the insulator region, wherein the termination structure further surrounds an electrostatic discharge feature,
- wherein the active device region and termination structure are formed into a semiconductor material of a first conductivity type,
- wherein the first conductive region is electrically connected to a gate metal and the second conductive region is connected to a drain metal.

11. The semiconductor device of claim 10, wherein the first and second conductive regions and the insulating region are formed in a common trench in the semiconductor material that surrounds the active region.

12. A semiconductor device comprising:
- an active device region containing a plurality of active devices; and
- a termination structure that surrounds the active device region, wherein the termination structure includes a first conductive region that surrounds the active device region, an insulator region that surrounds the first conductive region, and a second conductive region that surrounds the first conductive region and the insulator region, wherein a Schottky contact is formed outside of the termination structure,
- wherein the active device region and termination structure are formed into a semiconductor material of a first conductivity type,
- wherein the first conductive region is electrically connected to a gate metal and the second conductive region is connected to a drain metal.

13. The termination structure of claim 12, wherein the Schottky contact includes a body clamp feature.

14. A method for forming a semiconductor device comprising:
- forming an active device region containing a plurality of active devices in a semiconductor material of a first conductivity type;
- forming a termination structure that surrounds the active device region in the semiconductor material of the first conductivity type, wherein the termination structure includes a first conductive region that surrounds the active device region, an insulator region that surrounds the first conductive region, and a second conductive region that surrounds the first conductive region and the insulator region, wherein forming the termination structure includes:
- forming a termination trench in the semiconductor material of the first conductivity type, wherein the termination trench surrounds the active device region;
- lining sidewalls and a bottom surface of the termination trench with a dielectric material;
- disposing a conductive material in the termination trench, wherein the disposed conductive material lines the dielectric material on the sidewalls and the bottom surface;
- removing the conductive material on the bottom surface of the termination trench, wherein the first conductive region includes a first portion of the conductive material that remains on a sidewall of the termination trench that is closest to the one or more active semiconductor devices, and wherein second conductive region includes a second portion of the conductive material remains on a sidewall of the termination trench furthest from the one or more active semiconductor devices, and wherein the first and second portions of conductive material are not in contact with each other; and filling the space between the first and second portions of the conductive material with a trench filling insulator material;

forming an electrical connection between the first conductive region and a gate metal; and forming an electrical connection between the second conductive region and a drain metal.

15. The method of claim 14, further comprising:
lining the first and second portion of the conductive material with an insulative material and filling the remainder of the trench with a conductive material to form a shield electrode.

16. The method of claim 14, further comprising:
etching through the trench filling material and the dielectric material at the bottom of the trench; and
filling the trench with a conductive material to form a Schottky contact.

17. The method of claim 14, further comprising, forming an electrical field line tuning region of the second conductivity type below the termination trench.

18. The method of claim 14, wherein lining the sidewalls and bottom surface of the termination trench with the dielectric material comprises, lining an upper portion of the termination trench sidewalls with dielectric material to a first thickness, and lining a lower portion of the termination trench sidewalls with a dielectric material to a second thickness, wherein the second thickness is greater than the first thickness.

19. The method of claim 14, wherein forming the termination trench includes forming a mask over a top surface of a semiconductor substrate of a first conductivity type and etching the semiconductor substrate through openings in the mask to form a termination trench in the semiconductor substrate.

20. The method of claim 19, wherein the mask is a hard mask that includes first, second, and third insulator layers, wherein the second layer is sandwiched between the first and third layers, wherein the third layer is between the second layer and the top surface of the semiconductor substrate, and wherein the second layer is resistant to a first etch process that etches the material of the first and third layers, and wherein the first and third layers are resistant to a second etch process that etches the material of the second layer.

21. The method of claim 14, wherein the termination structure further surrounds a gate pickup feature.

22. A method for forming a semiconductor device comprising:
forming an active device region containing a plurality of active devices in a semiconductor material of a first conductivity type;
forming a termination structure that surrounds the active device region in the semiconductor material of the first conductivity type, wherein the termination structure includes a first conductive region that surrounds the active device region, an insulator region that surrounds the first conductive region, and a second conductive region that surrounds the first conductive region and the insulator region, wherein the termination structure further surrounds an electrostatic discharge feature;
forming an electrical connection between the first conductive region and a gate metal; and
forming an electrical connection between the second conductive region and a drain metal.

23. A method for forming a semiconductor device comprising:
forming an active device region containing a plurality of active devices in a semiconductor material of a first conductivity type;
forming a termination structure that surrounds the active device region in the semiconductor material of the first conductivity type, wherein the termination structure includes a first conductive region that surrounds the active device region, an insulator region that surrounds the first conductive region, and a second conductive region that surrounds the first conductive region and the insulator region;
forming an electrical connection between the first conductive region and a gate metal; and
forming an electrical connection between the second conductive region and a drain metal; and
forming a Schottky contact outside of the termination structure.

* * * * *